United States Patent [19]

Oritani

[11] Patent Number: 4,482,984
[45] Date of Patent: Nov. 13, 1984

[54] STATIC TYPE SEMICONDUCTOR MEMORY DEVICE

[75] Inventor: Atsushi Oritani, Yokohama, Japan

[73] Assignee: Fujitsu Limited, Kawasaki, Japan

[21] Appl. No.: 309,437

[22] Filed: Oct. 7, 1981

[30] Foreign Application Priority Data

Oct. 9, 1980 [JP] Japan .................... 55-141655

[51] Int. Cl.³ .......................................... G11C 11/40
[52] U.S. Cl. .................................... 365/154; 365/189
[58] Field of Search ............... 365/49, 104, 189, 154

[56] References Cited

U.S. PATENT DOCUMENTS 3,402,398  9/1968  Koerner et al. ................ 365/104
3,560,940  2/1971  Gaensslen ........................ 365/189
3,753,242  8/1973  Townsend ......................... 365/49

Primary Examiner—Terrell W. Fears
Attorney, Agent, or Firm—Staas & Halsey

[57] ABSTRACT

A static type semiconductor memory device including a plurality of cell array blocks which are formed by dividing a memory cell array in a direction of word lines and in a direction of bit lines. Each cell array block includes divided word lines and divided bit lines formed by dividing the word lines and the bit lines, respectively, with the access to a selected memory cell being effected by selecting only a divided word line and a divided bit line of the cell array block containing the selected memory cell.

15 Claims, 6 Drawing Figures

STATIC TYPE SEMICONDUCTOR MEMORY DEVICE

BACKGROUND OF THE INVENTION

1. Field of the Invention

The present invention relates to a static type semiconductor memory device, and more particularly to a semiconductor memory device in which a part of a word line and a part of a bit line can be selected at the same time in order to decrease the power consumption of the semiconductor memory device.

2. Description of the Prior Art

In recent years, the memory capacity of a semiconductor memory device has become larger and larger. When the memory capacity of a static type semiconductor memory device becomes large, a load current of each bit line becomes large and the stray capacitance of each bit line increases, so that the operating speed of the memory device becomes slow.

FIG. 1A is a schematic block diagram of a conventional static type RAM device and FIG. 1B is a partial circuit diagram of the RAM device. In these drawings, MCA designates a memory cell array having static type memory cells $MC_{0,0}$; . . . ; $MC_{N-1,0}$; . . . which are disposed in a matrix of N rows and M columns. For example, when a word line $X_0$ is selected by a word address decoder WD and a bit line or bit line pair $Y_0$ and $\overline{Y}_0$ is selected by a column decoder CD, a memory cell $MC_{0,0}$ disposed on a cross point of the word line $X_0$ and the bit line $Y_0$ is selected. Each of the memory cells, for example $MC_{0,0}$, comprises MIS transistors $Q_3$ through $Q_6$ and load resistors $R_1$ and $R_2$. Only one of the cross coupled transistors $Q_5$ and $Q_6$ is turned on by this means, and the other is turned off according to the information stored in the memory cell $MC_{0,0}$. When the word line $X_0$ is selected and the potential of the word line $X_0$ becomes, for example, high, the transfer transistors $Q_3$ and $Q_4$ are turned on. If the transistor $Q_5$ is turned on, a current flows from a voltage source $V_{DD}$ through an MIS bit line load transistor $Q_1$ of the bit line $Y_0$, the transistor $Q_3$ and the transistor $Q_5$ to another voltage source $V_{SS}$. In this condition, the transistor $Q_6$ is turned off and no current flows through an MIS load transistor $Q_2$ of the bit line $\overline{Y}_0$. Accordingly, there exists a potential difference between the bit lines $Y_0$ and $\overline{Y}_0$. A sense amplifier, which is not shown in the drawings, detects the potential difference and outputs the information stored in the memory cell $MC_{0,0}$. In FIG. 1B, MIS transistors $Q_7$ and $Q_8$ of the column decoder CD connect the selected bit line pair $Y_0$ and $\overline{Y}_0$ to the sense amplifier under the control of the output signal from a NOR gate "NOR" which receives column address signals $AC_0$ through $AC_{m-1}$, where $2^{m+1} = M$.

Concerning the power consumption of the above-mentioned static type RAM device, more than 60% of the total power consumption is consumed by the memory cell array portion and the remainder is consumed by the peripheral circuit portion of the memory cell array portion. With the increase in the memory capacity, the ratio of the electric power consumed by the memory cell array portion becomes larger and larger, but the electric power consumed by the peripheral circuit portion does not increase much. Of the electric power consumed by the memory cell portion, most of the power consumption is caused by the bit line current flowing at the access time, i.e., at the time the read out or the write in of information is effected, and the electric current necessary for holding the information stored in the memory cells is very small. Therefore, it is essential to decrease the power consumption of the memory cell array portion, especially to decrease the bit line current, in order to decrease the power consumption of the memory device.

In order to decrease the bit line current, it is possible to divide each of the word lines into two half sections and to select only one of the half sections to which the selected memory cell is connected. In such a structure, another one of the half sections of the selected word line is not selected and, therefore, the total current flowing from the bit lines through the memory cell to the ground can be reduced approximately by one half. However, in such a memory device, the length of each of the bit lines is the same as that of the memory device of FIG. 1, and the stray capacitance of each of the bit lines becomes very large when the memory capacity is increased. Therefore, it is necessary to increase the charge current flowing from the transistors $Q_1$ and $Q_2$ to the bit lines, so that the power consumption becomes large when the memory capacity is increased.

SUMMARY OF THE INVENTION

It is, therefore, an object of the present invention to reduce the power consumption of a static type semiconductor RAM device having a large memory capacity.

It is another object of the present invention to increase the read out and write-in speed of the static type semiconductor RAM device having a large memory capacity.

According to the present invention, there is provided a static type semiconductor memory device which includes a cell array having a plurality of memory cells disposed at cross points of a plurality of word lines and a plurality of bits lines. In the device access to a selected memory cell is effected by selecting a word line connected to the selected memory cell and by selecting a bit line connected to the selected memory cell according to input address signals. The device also includes a plurality of cell array blocks which are formed by dividing the cell array in a direction parallel to the word lines and in a direction parallel to the bit lines. Each cell array block includes divided word lines and divided bit lines formed by dividing the word lines and the bit lines respectively. The memory device additionally includes a word decoder section and a column decoder section which, respectively, select only a divided word line and a divided bit line of said cell array block containing the selected memory cell according to the input address signals.

DESCRIPTION OF THE PREFERRED EMBODIMENTS

Figure 2:
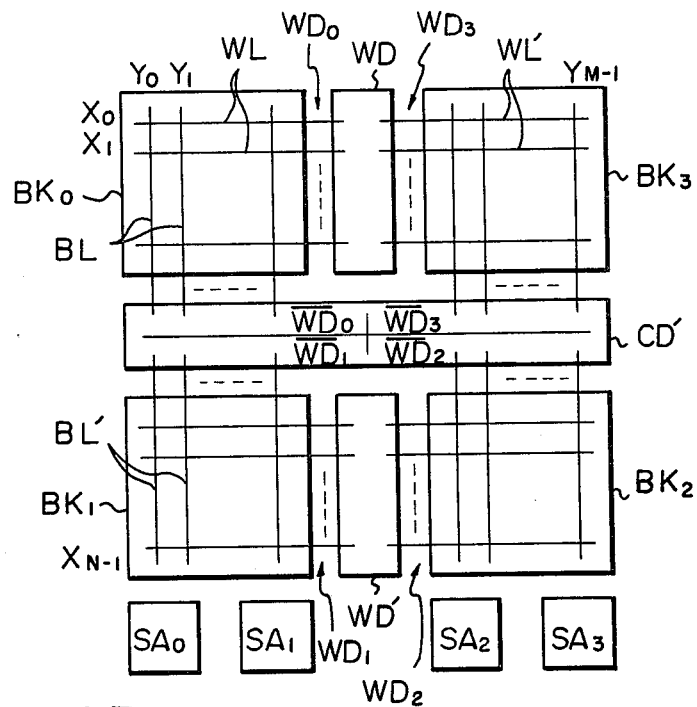
FIG. 2 is a block circuit diagram illustrating a static type semiconductor memory device as a first embodiment of the present invention.

As illustrated schematically in FIG. 2, in a semiconductor RAM device as a first embodiment of the present invention, a memory cell array is divided into four cell array blocks $BK_0$ through $BK_3$, and word lines $X_0$ through $X_{N-1}$ and bit lines $Y_0$ through $Y_{M-1}$ are respectively divided into two sections at the central portions thereof. In FIG. 2, WL and WL' designate divided word line sections of each of the word lines $X_0$ through $X_{N-1}$, and BL and BL' designate divided bit line sections of each of the bit lines $Y_0$ and $Y_{M-1}$. WD and WD' are word decoders disposed between the cell array blocks $BK_0$ and $BK_3$ and the cell array blocks $BK_1$ and $BK_2$. The word decoder WD selects one of the divided word lines WL of the cell array block $BK_0$ when a selecting signal $WD_0$ for the cell array block $BK_0$ is applied to the word decoder WD, and selects another one of the divided word lines WL' of the cell array $BK_3$ when a selecting signal $WD_3$ for the cell array block $BK_3$ is applied to the word decoder WD. The word decoder WD' selects one of the divided word lines WL of the cell array block $BK_1$ when a selecting signal $WD_1$ is applied thereto and selects one of the divided word lines WL' of the cell array block $BK_2$ when a selecting signal $WD_2$ is applied thereto. One of $N/2$ word lines of each of the cell array blocks is selected by $n-1$ bit address signals which are applied to the word decoders WD and WD' and which are not shown in FIG. 2, where $2^{n+1}=N$. The above-mentioned selecting signals $WD_0$ through $WD_3$ are formed from two bit address signals, each of which is also applied to the word decoder WD and WD' respectively. Therefore, the word lines $X_0$ through $X_{N-1}$ are selected by n bit address signals.

In FIG. 2, CD' is a unified column decoder which selects one of the divided bit line BL or BL' of the bit lines $Y_0$ through $Y_{M-1}$. Input address signals to the column decoder CD' include the inverted signals $\overline{WD_0}$ through $\overline{WD_3}$ of the aforementioned selecting signals $WD_0$ through $WD_3$ so that the column decoder CD' can select one of the divided bit lines from one of the cell array blocks $BK_0$ through $BK_3$ which is selected by the word decoder WD or WD'. Since the column decoder CD' selects one of the divided bit lines by applying a selecting pulse of a negative polarity, the inverted signals $\overline{WD_0}$ through $\overline{WD_3}$ are applied to the column decoder CD'. If a column decoder, which selects the divided bit line by applying a selecting pulse of a positive polarity, is used, non-inverted signals $WD_0$ through $WD_3$ are applied to the column decoder. In FIG. 2, $SA_0$ through $SA_3$ designate sense amplifiers connected to the cell array blocks $BK_0$ through $BK_3$, respectively.

Figure 3:
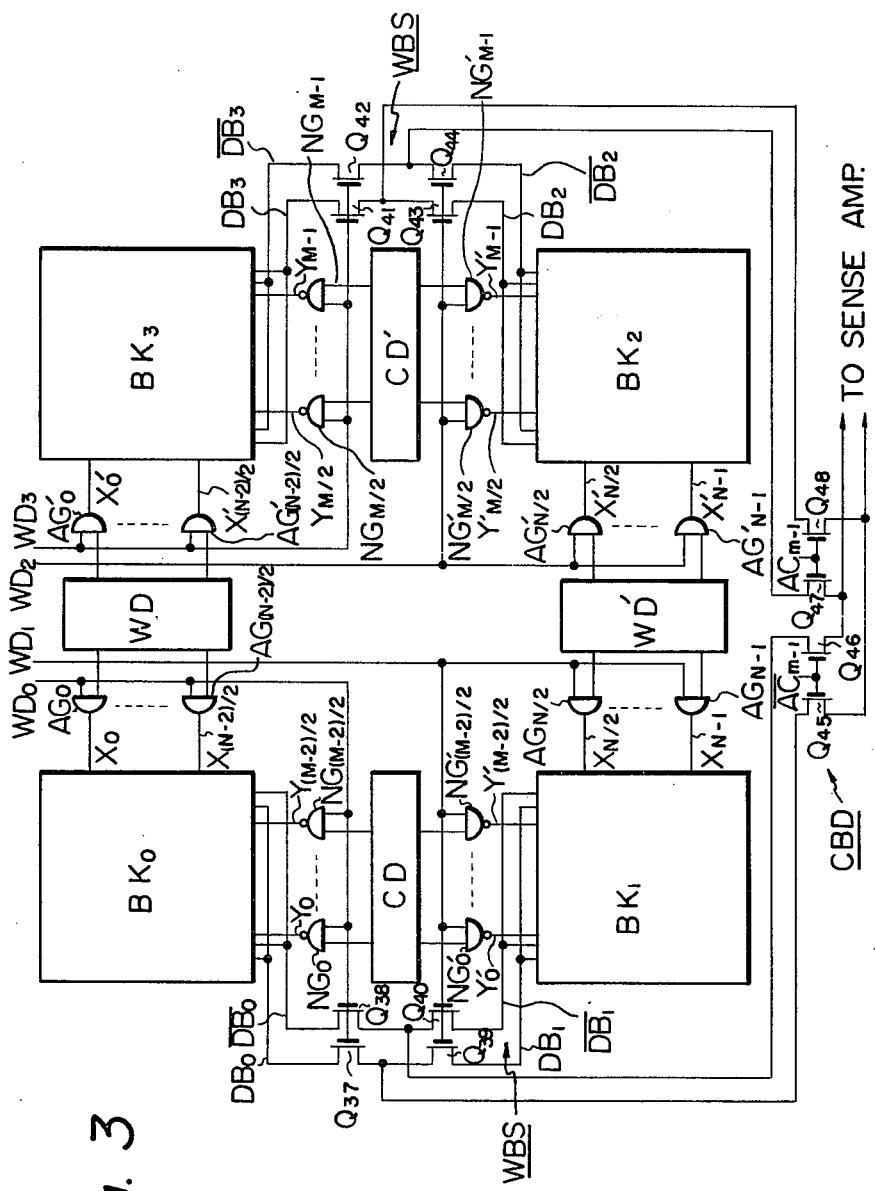
FIG. 3 is a block circuit diagram illustrating a static type semiconductor memory device as a second embodiment of the present invention.

FIG. 3 illustrates a static type RAM device as another embodiment of the present invention. The RAM device of FIG. 3 comprises four cell array blocks $BK_0$ and through $BK_3$, word decoders WD and WD', column decoders CD and CD', AND gates $AG_0$ through $AG_{N-1}$ and $AG'_0$ through $AG'_{N-1}$, NOR gates $NG_0$ through $NG_{M-1}$ and $NG'_0$ through $NG'_{M-1}$, gate transistors $Q_{37}$ through $Q_{44}$ comprising a word block selector WBS and gate transistors $Q_{45}$ through $Q_{48}$ constituting column block selector or decoder CBD.

The RAM device of FIG. 3 has substantially the same structure as that of the memory device of FIG. 2 and except that the RAM device of FIG. 3 uses only one sense amplifier which is connected to the gate transistors $Q_{45}$, $Q_{46}$ and $Q_{47}$ and $Q_{48}$ and which is not shown in FIG. 3. Each of the cell array blocks $BK_0$ and $BK_3$ has $(N/2) \times (M/2)$ bit memory cells arranged in a matrix of $N/2$ rows and $M/2$ columns, and selected by selecting signals $WD_0$ through $WD_3$, respectively. For example, when the selecting signal $WD_0$ becomes high, the word decoder WD selects one of divided word lines $X_0$ through $X_{(N-2)/2}$ of the cell array block $BK_0$ via the AND gates $AG_0$ through $AG_{(N-2)/2}$ and the column decoder CD selects one of divided bit lines $Y_0$ through $Y_{(M-2)/2}$ of the same cell array block $BK_0$ via the NOR gates $NG_0$ through $NG_{(M-2)/2}$. Therefore, when the selecting signal $WD_0$ is high, one of memory cells of the cell array block $BK_0$ is selected, and, for example, a read out signal from the selected memory cell is transferred through data buses $DB_0$ and $\overline{DB_0}$ and the gate transistors $Q_{37}$ and $Q_{38}$ which are turned on by the selecting signal $WD_0$ and through the gate transistors $Q_{45}$ and $Q_{46}$ to the sense amplifier (not shown in the drawing). The read out of information from each of the memory cells of the other cell array blocks $BK_1$ through $BK_3$ is effected in a similar manner to the read out of information from one of the memory cells of the cell array block $BK_0$ which is mentioned above. The gate transistors $Q_{45}$ and $Q_{46}$ and $Q_{47}$ and $Q_{48}$ comprise a column block selector or decoder CBD and select one of the groups of the cell array blocks each comprising the cell array blocks $BK_0$ and $BK_1$ or $BK_3$ and $BK_2$. The gate transistors $Q_{45}$ and $Q_{46}$ are controlled, for example, by the most significant bit $\overline{AC_{m-1}}$ of the column address signal and the gate transistors $Q_{47}$ and $Q_{48}$ are controlled by the inverted signal $AC_{m-1}$ of the most significant bit of the column address signal.

Figure 4B:
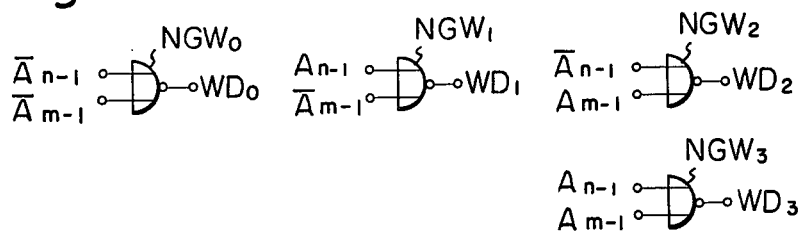
FIGS. 4A and 4B are circuit diagrams illustrating a detailed structure of the memory device of FIG. 3.
Figure 4A:
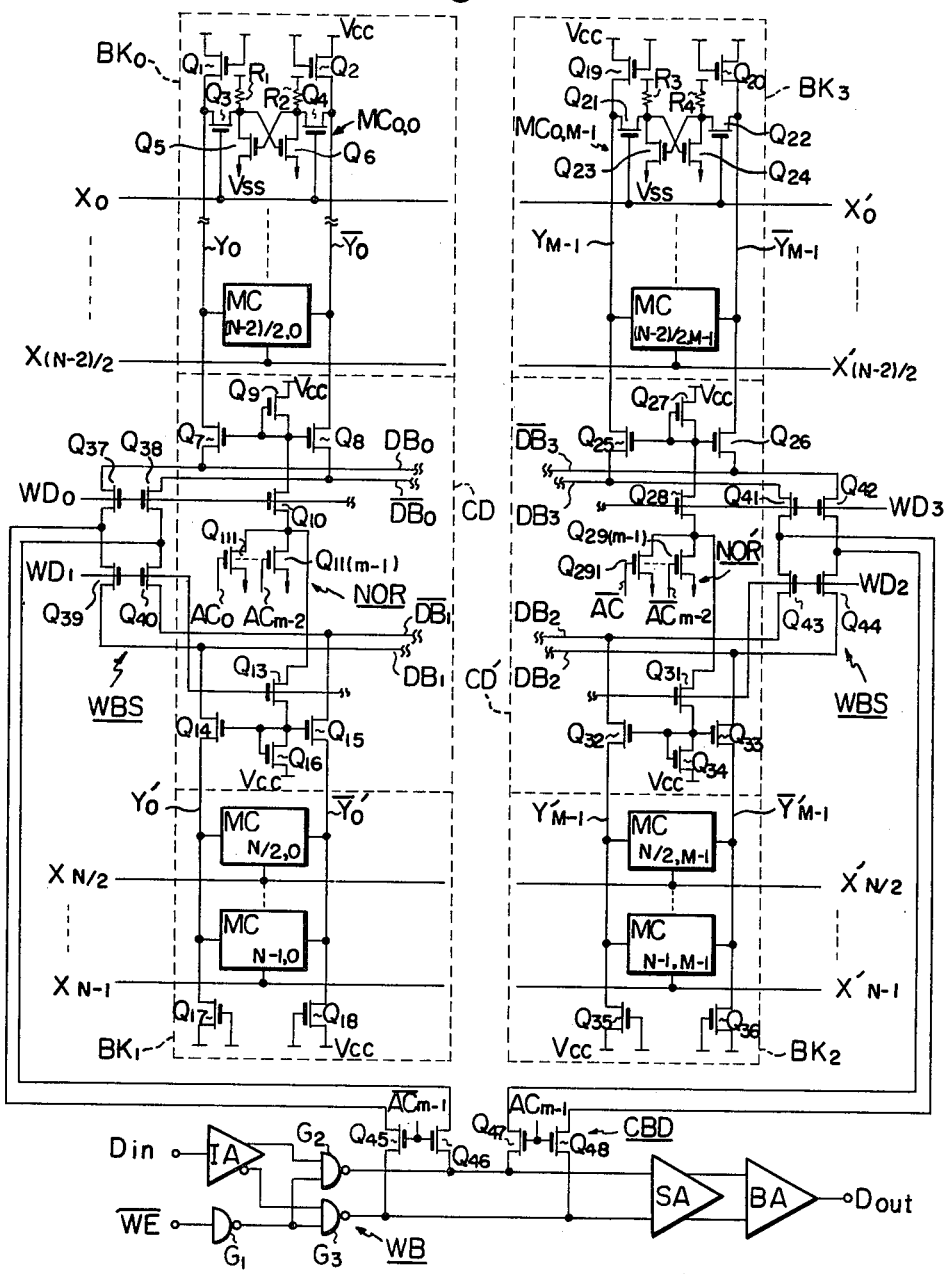

FIG. 4A is a partial detailed circuit diagram of the RAM device of FIG. 3. As illustrated in FIG. 4A, each of the memory cells of the cell array blocks $BK_0$ through $BK_3$ comprises mainly a flip-flop circuit. For example, the memory cell $MC_{0,0}$ of the cell array block $BK_0$ comprises a pair of cross coupled MIS transistors $Q_5$ and $Q_6$, load resistors $R_1$ and $R_2$ connected between the drain electrode of the transistors $Q_5$ and a voltage source $V_{CC}$ and between the drain electrode of the transistor $Q_6$ and the voltage source $V_{CC}$ respectively. The memory cell further comprises a pair of MIS transfer transistors $Q_3$ and $Q_4$ connected between the drain electrode of the transistor $Q_6$ and a divided bit line $Y_0$ and between the drain electrode of the transistor $Q_6$ and a divided bit line $\overline{Y_0}$. The gate electrodes of the transistors $Q_3$ and $Q_4$ are connected to a divided word line $X_0$. In this manner, $N/2$ one bit memory cells $MC_{0,0}$ through $MC_{(N-2)/2,0}$ of the cell array block $BK_0$ are connected between a pair of divided bit lines $Y_0$ and $\overline{Y_0}$ and to the divided word lines $X_0$ through $X_{(N-2)/2}$. The divided bit lines $Y_0$ and $\overline{Y_0}$ are connected to the voltage source $V_{CC}$ through bit line load transistors $Q_1$ and $Q_2$, respectively. The divided bit lines $Y_0$ and $\overline{Y_0}$ are connected to the data buses $DB_0$ and $\overline{DB_0}$, respectively, through MIS transistors $Q_7$ and $Q_8$. These transistors $Q_7$ and $Q_8$ are turned on and off by a bit drive signal supplied from a NOR gate of a column decoder CD comprising MIS transistors $Q_{111}$ through $Q_{11(m-1)}$, through a MIS transistor $Q_{10}$ which is controlled by the aforementioned selecting signal $WD_0$. The MIS transistors $Q_{111}$ through $Q_{11(m-1)}$ are turned on and off by $m-1$ bit column address signals $AC_0$ through $AC_{m-2}$, respectively which are supplied from column address buffers (not shown in the drawing). A depletion type MIS transistor $Q_9$ is a load transistor for the MIS transistor $Q_{10}$ and for the MIS transistors $Q_{111}$ through $Q_{11(m-1)}$ comprising the NOR gate.

The divided bit lines $Y'_0$ and $\overline{Y}'_0$ of the cell array block $BK_1$ are connected to the data buses $DB_1$ and $\overline{DB}_1$ through MIS transistors $Q_{14}$ and $Q_{15}$. The MIS transistors $Q_{14}$ and $Q_{15}$ are also controlled by the NOR gate "NOR" through a MIS transistor $Q_{13}$ which is controlled by the selecting signal $WD_1$. The bit lines $Y'_0$ and $\overline{Y}'_0$ are connected to the voltage source $V_{CC}$ through load transistors $Q_{17}$ and $Q_{18}$, respectively. N/2 one bit memory cells $MC_{N/2,0}$ through $MC_{N-1,0}$ are connected between the divided bit lines $Y'_0$ and $\overline{Y}'_0$ and to the divided word lines $X_{N/2}$ through $X_{N-1}$.

The structure of the other cell array blocks $BK_3$ and $BK_2$ and the other column decoder $CD'$ are substantially the same as those of the cell array blocks $BK_0$ and $BK_1$ and the column decoder $CD$.

The data buses $DB_0$ and $\overline{DB}_0$, and, $DB_1$ and $\overline{DB}_1$ are commonly connected to the gate transistors $Q_{45}$ and $Q_{46}$ of the column block decoder CBD through the gate transistors $Q_{37}$ and $Q_{38}$ of the word block selector WBS and through the gate transistors $Q_{39}$ and $Q_{40}$ of the word block selector WBS, respectively. Similarly, the data buses $DB_3$ and $\overline{DB}_3$, and, $DB_2$ and $\overline{DB}_2$ are commonly connected to the gate transistors $Q_{48}$ and $Q_{47}$ of the column block decoder CBD through the gate transistors $Q_{41}$ and $Q_{42}$ of the word block selector WBS and through the gate transistors $Q_{43}$ and $Q_{44}$ of the word block selector WBS, respectively. The column block selector CBD is connected to a sense amplifier SA and a buffer amplifier BA and to a write-in buffer WB comprising an input amplifier and three NAND gates G1 through G3.

The selecting signals $WD_0$ through $WD_3$ are formed by NAND gates $NGW_0$ through $NGW_3$ respectively to which the address signals $A_{n-1}$, $\overline{A}_{n-1}$, $A_{m-1}$ and $\overline{A}_{m-1}$ are applied, as illustrated in FIG. 4B.

The operation of the circuit of FIGS. 4A and 4B will now be explained. When the read-out of information from the memory cell, for example, $MC_{00}$ is effected, the potential level of the divided word line $X_0$ is caused to be high and the transistors $Q_3$ and $Q_4$ are turned on. In this case, the column address signals $AC_0$ through $AC_{m-2}$ are all low and the selecting signal $WD_0$ is high. Therefore, the transistors $Q_{10}$, $Q_{37}$ and $Q_{38}$ are all turned on and the level of the output potential of the NOR gate "NOR" is high, so that the transistors $Q_7$ and $Q_8$ are both turned on. In this case, since the column address signal $\overline{AC}_{m-1}$ is high, the transistors $Q_{45}$ and $Q_{46}$ are turned on. Therefore, the potential difference between the drain electrodes of the transistors $Q_5$ and $Q_6$ of the memory cell $MC_{0,0}$ is transferred to the sense amplifier SA and the buffer amplifier BA and the read-out data $D_{out}$ corresponding to the potential difference is outputted.

When the write-in of information to the same memory cell is effected, the potential level of the word line $X_0$ is caused to be high, the selecting signal $WD_0$ is caused to be high and the column address signals $AC_0$ through $AC_{m-1}$ are all caused to be low. Therefore, a write-in signal from the write-in buffer WB is transferred to the memory cell $MC_{0,0}$ and the write-in of information is effected.

Figure 1A:
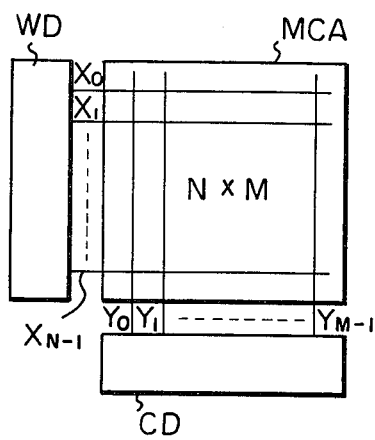
FIG. 1A and FIG. 1B are block circuit diagrams illustrating a conventional static type semiconductor RAM device.
Figure 1B:
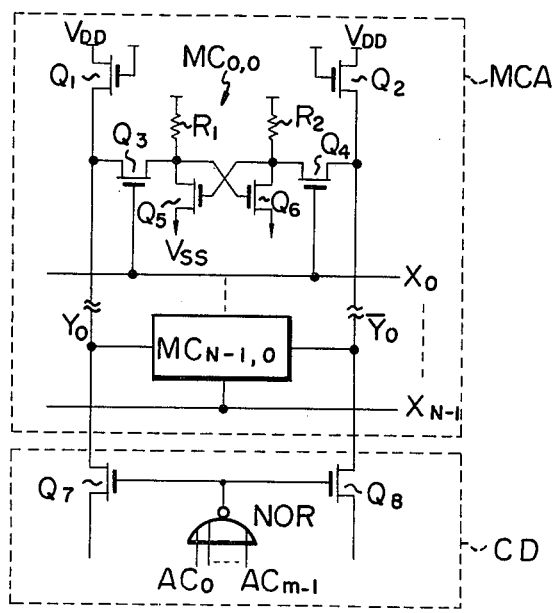

In these operations, only one divided word line $X_0$ becomes high and all the other divided word lines of the cell array block $BK_0$ and of the cell array blocks $BK_1$ through $BK_3$ are low. Therefore, the load current flowing from the bit lines through the memory cells to the voltage source $V_{SS}$ (from example, ground) can be decreased to half that of the conventional memory device of FIG. 1. Moreover, since the gate transistors $Q_{14}$ and $Q_{15}$ are in a turned off condition, the stray capacitance of the bit line pair $Y_0$ and $\overline{Y}_0$ can be decreased to half that of the conventional memory device of FIG. 1. Therefore, the transconductance gm of each of the load transistors $Q_1$ and $Q_2$ can be decreased to half that of the conventional memory device, i.e., the charge current of each of the bit lines can be decreased to half that of the conventional memory device without reducing the charging speed of each of the bit lines. As a result, the power consumption of the above-mentioned memory device can be decreased to a quarter of that of the conventional memory device of FIG. 1.

In the above embodiments, the memory cell array is divided into four blocks. However, it should be noted that the memory cell array can be divided into a larger number of blocks, and it is possible to decrease the power consumption of the memory device even more.

Therefore, according to the present invention, it is possible to decrease the power consumption of the static type RAM device having a large memory capacity without reducing the operation speed thereof.

I claim:

1. A static type semiconductor memory device, comprising:
    a cell array having a plurality of memory cells disposed at cross points of a plurality of word lines and a plurality of bit lines, and in which memory device the access to a selected memory cell is effected by selecting a word line connected to the selected memory cell and by selecting a bit line connected to the selected memory cell according to input address signals, said cell array comprising a plurality of cell array blocks which are formed by dividing said cell array in a direction parallel to said word lines and in a direction parallel to said bit lines and each cell array block comprising divided word lines and divided bit lines formed by dividing said word lines and said bit lines, respectively, each of said memory cells comprising:
    a pair of cross coupled transistors;
    a pair of load elements operatively connected between a voltage source and said pair of cross coupled transistors, respectively; and
    a pair of transfer transistors operatively connected between said pair of cross coupled transistors and a pair of said divided bit lines, respectively, and having gate electrodes operatively connected to one of said divided word lines; and
    a word decoder section and a column decoder section, both operatively connected to said cell array, which, respectively, select only a divided word line and a divided bit line of said cell array block containing the selected memory cell according to said input address signal.

2. A memory device as recited in claim 1, wherein said word decoder section comprises a plurality of word decoders each operatively connected to two cell array blocks, each of which selects one of said divided word lines of one of said cell array blocks.

3. A memory device as recited in claim 2, wherein said input address signals include selecting signals, and wherein said word decoder section further comprises a word block selector, operatively connected to said cell array blocks, which selects one of the cell array blocks in dependence upon said selecting signals.

4. A memory device as recited in claim 1, wherein said column decoder section comprises a plurality of column decoders, each operatively connected to two cell array blocks, each of which selects one of said divided bit lines of said cell array blocks.

5. A memory device as recited in claim 4, wherein said column decoder section further comprises a column block selector, operatively connected to said cell array blocks, which selects a group of said cell array blocks disposed in the same column in dependence upon a part of said input address signals.

6. A memory device as recited in claim 2 or 3, wherein said word decoders are disposed between cell array blocks.

7. A memory device as recited in claim 4 or 5, wherein said column decoders are disposed between said cell array blocks.

8. A memory device as recited in claim 1, wherein said cell array is divided into four cell array blocks and each of said word lines and each of said bit lines are divided into two divided word lines and two divided bit lines, respectively.

9. A memory device as recited in claim 1, wherein said memory device comprises a sense amplifier, operatively connected to said cell array blocks, which senses information in the selected memory cell, and wherein only the divided bit line which is selected is connected to said sense amplifier.

10. A memory device as recited in claim 1, wherein said divided bit lines are operatively connected to the voltage source through bit line loads, respectively.

11. A memory device as recited in claim 10, wherein said memory device further comprises a sense amplifier which senses information in the selected memory cell, and wherein only the pair of divided bit lines which are selected is connected to said sense amplifier.

12. A memory device, comprising:
first through fourth cell array blocks including memory cells having connected thereto first through fourth word line sets and first through fourth bit line sets, each memory cell having one word line and one bit line connected thereto;
a first word decoder operatively connected to said first and said fourth cell array blocks via said first and fourth word lines sets, respectively;
a second word decoder operatively connected to said second and said third cell array blocks via said second and third word line sets, respectively;
a unified column decoder operatively connected to said first through fourth cell array blocks via said first through fourth bit line sets, respectively;
means for generating first through fourth selection signals;
a first AND gate set, operatively connected to said first cell array block, said first word decoder and said means for generating, for selecting said first cell array block in dependence upon the first selection signal;
a second AND gate set, operatively connected to said second cell array block, said second word decoder and said means for generating, for selecting said second cell array block in dependence upon the second selection signal;
a third AND gate set, operatively connected to said third cell array block, said second word decoder and said means for generating, for selecting said third cell array block in dependence upon the third selection signal;
a fourth AND gate set, operatively connected to said fourth cell array block, said first word decoder and said means for generating, for selecting said fourth cell array block in dependence upon the fourth selection signal;
a first NOR gate set, operatively connected to said first cell array block, said first column decoder and said means for generating, for selecting said first cell array block in dependence upon the first selection signal;
a second NOR gate set, operatively connected to said second cell array block, said first column decoder and said means for generating, for selecting said second cell array block in dependence upon the second selection signal;
a third NOR gate set, operatively connected to said third cell array block, said second column decoder and said means for generating, for selecting said third cell array block in dependence upon the third selection signal;
a fourth NOR gate set, operatively connected to fourth cell array block, said second column decoder and said means for generating, for selecting said fourth cell array block in dependence upon the fourth selection signal;
first through fourth word block selectors operatively connected to said first through fourth cell array blocks, respectively, and to said means for generating;
a column block decoder operatively connected to said first through fourth word block selectors; and
a sense amplifier operatively connected to said column block decoder.

13. A memory device as recited in claim 12, wherein said sense amplifier comprises first through fourth sense amplifiers operatively connected to said first through fourth cell array blocks, respectively.

14. A memory device as recited in claim 12, wherein said unified column decoder comprises:
a first column decoder operatively connected to said first and second cell array blocks via said first and second bit line sets, respectively; and
a second column decoder operatively connected to said third and fourth cell array blocks via said third and fourth bit line sets, respectively.

15. A memory device as recited in claim 13, wherein said means for generating the first through fourth selection signals comprises first through fourth NAND gates operatively connected both to said AND and NOR gate sets, respectively.

* * * * *

UNITED STATES PATENT AND TRADEMARK OFFICE
CERTIFICATE OF CORRECTION

PATENT NO. : 4,482,984
DATED : November 13, 1984
INVENTOR(S) : ATSUSHI ORITANI

It is certified that error appears in the above-identified patent and that said Letters Patent is hereby corrected as shown below:

Column 3, line 66, delete "and" and insert --,--.

Column 4, line 1, "$Q_{45}$, $Q_{46}$" should be --Q45 and Q46--.

Column 6, line 1, "from" should be --for--.

Column 8, claim 15, line 1, "13" should be --12--.

Signed and Sealed this

Fourteenth Day of May 1985

[SEAL]

Attest:

DONALD J. QUIGG

Attesting Officer     Acting Commissioner of Patents and Trademarks